United States Patent
Joet

(10) Patent No.: US 11,085,945 B2
(45) Date of Patent: Aug. 10, 2021

(54) STRAIN GAUGE SENSOR ACCELEROMETER WITH IMPROVED ACCURACY

(71) Applicant: COMMISSARIAT A L'ENERGIE ATOMIQUE ET AUX ENERGIES ALTERNATIVES, Paris (FR)

(72) Inventor: Loïc Joet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 195 days.

(21) Appl. No.: 16/517,061

(22) Filed: Jul. 19, 2019

(65) Prior Publication Data

US 2020/0025793 A1 Jan. 23, 2020

(30) Foreign Application Priority Data

Jul. 23, 2018 (FR) ...................................... 1856789

(51) Int. Cl.
*G01P 15/12* (2006.01)
*G01P 15/08* (2006.01)

(52) U.S. Cl.
CPC .... *G01P 15/123* (2013.01); *G01P 2015/0877* (2013.01)

(58) Field of Classification Search
CPC ...... G01P 15/12; G01P 15/122; G01P 15/123; G01P 2015/0877
See application file for complete search history.

(56) References Cited

U.S. PATENT DOCUMENTS

| 2012/0210792 A1* | 8/2012 | Robert | G01P 15/0802 |
| | | | 73/514.29 |
| 2013/0104677 A1 | 5/2013 | Watanabe et al. | |
| 2015/0013456 A1 | 1/2015 | Hada et al. | |
| 2019/0177153 A1* | 6/2019 | Lhermet | B81B 3/0018 |

(Continued)

FOREIGN PATENT DOCUMENTS

| EP | 2 211 185 A1 | 7/2010 |
| FR | 2 906 038 A1 | 3/2008 |

(Continued)

OTHER PUBLICATIONS

Plaza, et al., "Piezoresistive accelerometers for MCM package", Journal of Microelectromechanical Systems, vol. 11, Issue 6, pp. 794-801, Dec. 1, 2002.

*Primary Examiner* — Helen C Kwok
(74) *Attorney, Agent, or Firm* — BakerHostetler

(57) ABSTRACT

An MEMS or NEMS accelerometer adapted to measure an acceleration along a sensing axis includes a substrate featuring a plane; a mass having a central zone and suspended relative to the substrate; a single lever arm comprising: a first end connected to the substrate by means of a first connection adapted to allow rotation of the lever arm about a rotation axis perpendicular to the sensing axis, and a second end connected to the mass by means of a second connection adapted to transmit movement in translation of the mass to the lever arm whilst allowing rotation of the lever arm about the rotation axis; the second end of the lever arm being disposed at the level of the central zone of the mass; at least one strain gauge comprising: a first end connected to the substrate, and a second end connected to the lever arm.

16 Claims, 10 Drawing Sheets

(56) References Cited

U.S. PATENT DOCUMENTS

2021/0018378 A1* 1/2021 Joet .................. G01P 15/125
2021/0021944 A1* 1/2021 Joet .................. H04R 19/04

FOREIGN PATENT DOCUMENTS

FR      2 951 826 A1    4/2011
FR      3 000 484 A1    7/2014
WO       94/14035 A1    6/1994

* cited by examiner

STRAIN GAUGE SENSOR ACCELEROMETER WITH IMPROVED ACCURACY

CROSS-REFERENCE TO RELATED APPLICATIONS

This application claims priority to foreign French patent application No. FR 18 56789, filed on Jul. 23, 2018, the disclosure of which is incorporated by reference in its entirety.

FIELD OF THE INVENTION

The invention is situated in the field of accelerometers, to be more precise NEMS or MEMS accelerometers, i.e. accelerometers produced by micromachining in a wafer of monolithic material, such as silicon, by means of collective fabrication technologies similar to those that are used in the fabrication of electronic integrated circuits.

BACKGROUND

Such accelerometers have multiple applications, in particular in fields where the aim is to obtain both a minimum overall size and a low production cost. One special field of application is the field of automotive or aeronautic navigation, in which these accelerometers enable a trajectory to be determined by integrating the signals that they supply.

An accelerometer is expected to have a certain number of characteristics, and primarily a smaller overall size, good sensitivity to acceleration on a clearly defined axis that might also be termed the "sensing axis", as low as possible a sensitivity on the other axes, good measurement accuracy, good mechanical strength, and low cost.

The fabrication technologies used in microelectronics lend themselves particularly to obtaining a low fabrication cost and the cost is then directly linked to the size of the micromachined component.

In the application envisaged for the accelerometer, the aim will be to optimize the various characteristics referred to above and the necessary compromises will be made, for example a compromise between small size and good sensitivity.

A NEMS or MEMS accelerometer generally comprises a mobile mass (proof mass) connected to the substrate from which it has been machined by an elastic connection. The function of the mass is to transform an acceleration into a force. A number of translations of the movement of the mass into the electrical domain are possible, the most widespread being capacitive sensing and strain gauge sensing.

In the latter case, at least one gauge is fixed between the mass and the substrate, either directly or indirectly, and is subjected to the forces linked to the movement of the seismic mass during acceleration.

There may be one or more strain gauges.

The forces are transmitted to the gauge directly or indirectly, for example via mechanical amplification by a lever arm. The lever arm and the mass may advantageously be one and the same if the mass rotates on a hinge. In other words, the mass may also have the mechanical amplification function.

The lever arm enables transmission of force from the mass to the gauge whilst, in order to increase sensitivity, adding a gain between the force harvested by the mass and the force applied to the gauge.

The acceleration axis or "sensing axis" is either in the plane of the substrate ("in-plane") or outside the plane of the substrate ("out-of-plane"), as described in the patent application EP2211185.

In the out-of-plane case, the lever arm can advantageously enable transformation of an out-of-plane movement into an in-plane movement.

Accordingly, depending on the configuration of the accelerometer, the choice may be made to carry out measurements on one of the three axes.

Finally, with the use of at least two gauges, a lever arm enables differential reading thanks to astute positioning of the gauges relative to the rotation axis of the lever arm.

An example of an accelerometer employing in-plane movement is described in the patent application FR2951826, which describes an in-plane piezoresistive sensing device. To be more precise this is a MEMS and/or NEMS type accelerometer intended to measure movements oriented along an in-plane axis.

The accelerometer includes a seismic mass adapted to move along the acceleration axis. It is suspended by at least one beam. The beam forms a pivot connection, the pivot axis being orthogonal to the plane of the device, and the mass is therefore able to move in-plane about this pivot axis.

The accelerometer further comprises at least one piezoresistive gauge. The gauge or gauges has/have a smaller thickness than the seismic mass. The reduced section of the gauge enables a higher stress to be obtained within a gauge, at constant force. The axis perpendicular to the pivot axis and passing through the centre of gravity of the seismic mass is perpendicular to the axis of the acceleration to be measured and the axis of the gauge is perpendicular to the axis connecting the pivot axis and the centre of gravity of the seismic mass.

The mass therefore also enables mechanical amplification by forming a lever arm rotating about the pivot connection, the distance between the pivot connection and the gauge being less than the distance between the pivot connection and the centre of gravity of the mass (conversely, an attenuation could be obtained the benefit of greater stiffness and therefore a higher resonant frequency).

FIG. 1 shows the accelerometer according to the patent application FR2951826, which comprises a seismic mass 2 retained by two beams 4.1 and 4.2 on a substrate 7 (not represented in this figure, but represented in another figure of said patent application).

Each beam is fixed at one end to the substrate at two distinct points via an anchor pad 6 and at another end to the seismic mass 2. In the plane Oxy, the beams have a length defining their longitudinal direction and a width. They further have a thickness along the axis Oz. The intersection of the beams, and be more precise of axes extending in the longitudinal direction of each beam and situated on the half-width of each beam, defines a pivot axis R of said seismic mass. In other words, the beams allow rotation of the mass in the plane XY (the beams are fine as seen in plan and therefore oppose a low stiffness in bending to the in-plane rotation) about the pivot axis R. Moreover, they block in-plane other movements by their high stiffness in compression, and also block out-of-plane movements by their high out-of-plane bending stiffness (the beams are thick seen perpendicularly to the plane).

The two beams thus form a hinge connection, or pivot connection, the axis R of which is perpendicular to the plane of the substrate (the axis R is parallel to the axis Z), about which axis the seismic mass is able to pivot because of the effect of the acceleration.

An acceleration along the sensing axis (here the axis Y1, which is parallel to the axis Y) leads to rotation of the mass in the plane XY about the pivot axis R. This rotation actuates a gauge 8 (or gauges, for example a gauge functioning in compression with another gauge functioning in traction), mechanically connected to the seismic mass and to the substrate. The gauge (or gauges) measure(s) the movement of the mass.

It is thereafter possible to deduce therefrom the acceleration.

The strain gauges are advantageously placed near the hinge, in order to benefit from a lever arm.

The out-of-plane accelerometers function according to the same principle. The hinge is then produced by torsion bars and/or out-of-plane bending bars that may be made thinner so as to be less stiff.

The gain of the lever arm is given by the ratio between the length of the lever arm, that is to say the distance $D_{bras}$ between the centre of rotation R formed by the hinge and the centre of gravity G of the mass where the force resulting from the acceleration is applied, and the distance $D_{jauge}$ between the centre of rotation R and the point of contact J of the gauge 8 on the mass.

The lever arm enables adjustment of the sensitivity of the accelerometer. The sensitivity is therefore a function of the ratio $D_{bras}/D_{jauge}$ and increases with the length of the lever arm.

Conversely, the natural resonant frequency of the mass decreases with the length of the lever arm. It also decreases with the moment of inertia of the mass (to be more precise with the square root of the moment of inertia). This can be demonstrated in the following manner.

The moment contributed by a gauge at the level of the hinge is given by the product of the force of the gauge by the distance $D_{jauge}$:

$$M_{jauge} = F_{jauge} D_{jauge}$$

The gauge functioning as a spring, the force that it supplies is the product of its stiffness by its compression/extension:

$$F_{jauge} = K_{jauge} \delta l_{jauge}$$

The compression/extension of the gauge is given by the product of the angle of the lever arm by the distance to the rotation centre:

$$\delta l_{jauge} = \alpha D_{jauge}$$

From these three equations we can deduce the angular stiffness provided by a gauge on the lever arm:

$$C_{jauge} = \frac{M_{jauge}}{\alpha} = K_{jauge} D_{jauge}^2$$

To simplify the reasoning, it is considered that the hinge is dimensioned so that its angular stiffness is negligible compared to that of the gauges. The other characteristic needed to obtain the resonant frequency of the mass is its moment of inertia.

If it is firstly considered that the mass is a point mass, the moment of inertia is then given by the product of its weight by the square of the distance $D_{bras}$:

$$I = m D_{bras}^2$$

The resonant frequency of the mass is given by the square root of the ratio of the angular stiffness to the inertia of the mass:

$$\omega_o = \sqrt{\frac{C_{jauge}}{I}} = \frac{D_{jauge}}{D_{bras}} \sqrt{\frac{K_{jauge}}{m}}$$

The inventors are seeking to increase the resonant frequency of the mass, in particular so as to be able to detect phenomena at a higher frequency (the resonant frequency must be higher than the frequency that it is wished to detect). It is clear from the above equation that this contradicts the increase in the sensitivity by the lever arm $D_{bras}/D_{jauge}$.

The aim is also to apply the highest force to the gauge for a given mass. The force harvested by the mass is equal to the harvested acceleration multiplied by the weight of the mass, that is to say:

Force=mγ

Thus if the aim is to increase the force harvested by the mass, the weight of the mass may be increased (ratio Δm). Now, the frequency is also inversely proportional to the square root of the weight m of the mass. Thus if the force is increased by a factor equal to Δm the frequency is reduced by the square root of Δm. In the end, there is obtained a better compromise of value equal to a square root of Δm.

The problem is that the weight of the mass is increased by increasing the size of the mass, and in the end of the accelerometer. Now the aim is to limit the size of the accelerometer, in particular to limit its cost.

Moreover, the moment of inertia of the mass is not strictly that of a point mass, the mass being closer to a rectangle of length $L_{masse}$ and of width $l_{masse}$ than a point. A rectangle of this kind, rotating about the middle of its width, has in fact a higher moment of inertia than a point mass:

$$I = \frac{m}{2}\left[L_{masse}^2 + \frac{l_{masse}^2}{4}\right]$$

If this mass approximates a square with a side length of $2D_{bras}$, the moment of inertia is in fact 5/3 times that of a point mass, with the aforementioned impact on the resonant frequency.

$$\omega_o = \sqrt{\frac{C}{I}} = \frac{D_{jauge}}{D_{bras}} \sqrt{\frac{K_{jauge}}{\frac{5}{3}m}}$$

It is therefore clear that there exists a compromise between the following 3 parameters: the size of the mass (and therefore the weight of the mass), the sensitivity of the accelerometer, and the resonant frequency of the mass.

The aim is in particular to obtain an accelerometer that uses the minimum mass for a given resonant frequency and a given sensitivity.

An accelerometer exists in the patent application FR2906038 in which the movements of the mass and of the lever arm are dissociated.

FIG. 2 shows part of an accelerometer according to the patent application FR2906038. The mass 10 moves along the axis Oy and the movement in translation of the mass is transferred to the end of a lever arm 30 by means of a connection 36 between the seismic mass 10 and the lever arm 30.

There are two lever arms and two connections. Each lever arm is disposed on an edge of the mass. Each lever arm moreover rotates about the axis Oz by means of a hinge connection formed by two flexible arms 38 and 40. Said connection 36 is elastic in the direction Ox (perpendicular to Oy) but rigid in the direction Oy (and must absorb the rotation angle).

The connection 36 between the seismic mass and the lever arm may be provided by a rectilinear flexible arm elongate in the direction Oy but thin in the direction Ox so that it is able to bend in the direction Ox.

Thus only the lever arm 30 rotates, not all of the mass 10, which enables reduction of the inertia of the mass. The mass moving in translation, it acts as a point mass at the end of the lever arm (rather than a mass of rectangular type). Thus, with this configuration, it is theoretically possible to obtain the same sensitivity and the same resonant frequency with a mass moving in translation 5/3 times smaller than a square mass moving in rotation.

The movement in rotation of the lever arm is transmitted to a resonant beam 20.

However, in the patent application FR2906038, it is seen that there must necessarily be symmetry about the axis Ox, that is to say perpendicularly to the sensing axis Oy. In fact, two lever arms 30 and 30' are necessary for a mass 10 to prevent the mass from turning because of the effect of the acceleration along the sensing axis Oy.

This leads to a risk, in the case of imperfect symmetry, that the mass will turn at the same time as one or the other of the two lever arms, the consequence of which is again to increase the moment of inertia of the mass and therefore to reduce the resonant frequency.

Moreover, there is a gauge (resonant beam) 20, 20' for each lever arm 30, 30' and, because of the symmetry, the gauges (resonant beams) are not side by side. Now, because of the method of fabricating an accelerometer (micromachining a wafer of monolithic material, such as silicon on insulator (SOI)), the differences between two gauges increase with the distance between them. The differences are such that this induces a loss of accuracy, in particular if a differential measurement is carried out, and it is generally necessary to recalibrate the signals between the two gauges.

The lever arms can also create differences at the level of the gauges if they are not perfectly similar.

The invention aims to overcome the aforementioned disadvantages of the prior art.

What is sought is therefore an accelerometer that enables the product of resonant frequency times sensitivity to be increased for the same overall size and that is accurate, in particular when using two strain gauges for differential measurement.

SUMMARY OF THE INVENTION

The invention enabling this aim to be achieved is an MEMS or NEMS accelerometer adapted to measure an acceleration along a sensing axis comprising:
- a substrate featuring a plane;
- a mass having a central zone and suspended relative to the substrate;
- a single lever arm forming a mass force amplification structure, comprising:
  - a first end connected to the substrate by means of a first connection adapted to allow rotation of the lever arm about a rotation axis perpendicular to the sensing axis, and
  - a second end connected to the mass by means of a second connection adapted to transmit the movement in translation of the mass to the lever arm whilst allowing rotation of said lever arm about the rotation axis;
  - the second end of the lever arm being disposed at the level of the central zone of the mass;
- at least one strain gauge, said gauge being connected to the lever arm, each gauge comprising:
  - a first end connected to the substrate, and
  - a second end connected to the lever arm.

The "sensing axis" is the axis of the acceleration to be measured.

The terms "thickness", "thick", "thinness", "thin" refer to dimensions perpendicular to the plane of the substrate.

The terms "fine", "fineness", "wide", "width", "elongate", "elongation", "length", "long" refer to dimensions in the plane of the substrate (or in a plane parallel to the plane of the substrate).

By "coupling" is meant the connection between two parts to enable mechanical transmission from one to the other along at least one axis.

The accelerometer according to the invention comprises only one lever arm, whether there are one or two strain gauges (or even more than two gauges).

Moreover, the lever arm and the mass move differently, the mass not turning (or turning very little).

Finally, the point of connection of the lever arm to the mass is at the heart of said mass. The lever arm is not disposed on one side of the mass.

The mass acts on at least one strain gauge via the lever arm.

The invention enables a better compromise to be maintained between the size of the mass (and therefore the weight of the mass), the sensitivity of the accelerometer and the frequency of the mass.

In particular, for an accelerometer of given mass, it enables a better product of resonant frequency times sensitivity to be obtained.

Moreover, there is no longer any error due to the use of two lever arms that in general are neither perfectly identical nor disposed in a perfectly symmetrical manner relative to the mass.

Finally, during the NEMS/MEMS fabrication process, and in particular when gluing the substrate-mass-lever-pads-connections-gauge(s) assembly (also termed the "chip") into a casing, slight deformation of the chip can occur. These deformations impact all the more the farther apart the anchor pads on the substrate, and induce measurement errors. Such deformations can also occur in the event of thermal expansion of the chip.

This is particularly critical for anchoring each gauge and for anchoring hinge type connections which must therefore advantageously be close together.

The accelerometer according to the invention enables maximum anchorages to be disposed close together, that is to say in a small area, in particular, especially when there are multiple gauges, for anchoring the gauges. The defects are therefore transmitted less from one gauge to another. This enables an even more precise measurement to be obtained.

This also enables a more stable measurement to be obtained (in particular subject to less temperature drift).

In other words, the effects of the stressing of the substrate, in particular due to gluing the chip and to thermal expansion, are greatly reduced thanks to the proximity of the anchorages.

According to one advantageous embodiment, the accelerometer comprises at least two strain gauges.

By using two strain gauges, which in particular enables differential measurement, the invention enables the two gauges to be very close together on a single lever arm, which enables a much more precise measurement to be obtained. In fact, it has to be remembered that, because of the NEMS or MEMS fabrication process, two gauges close together are much more similar than two gauges far apart. The accelerometer according to the invention enabling the gauges to be moved closer together, there are fewer errors due to the differences between the two gauges. In other words, the technological variations between two gauges are reduced thanks to the proximity of said gauges, which leads to improved differential measurement without needing recalibration of the signals from the two gauges.

According to one particular embodiment, the two strain gauges are disposed on respectively opposite sides of the first end of the lever arm. This enables better differential measurement.

According to one embodiment, the mass is suspended relative to the substrate by at least one third connection adapted to allow movement in translation of said mass along the sensing axis.

According to one particular embodiment, at least one third connection comprises a flexible blade along the sensing axis.

According to one particular embodiment, the accelerometer comprises a plurality of third connections distributed in a balanced manner relative to the centre of gravity of the mass.

According to another embodiment, the mass is suspended relative to the substrate only by the lever arm.

According to one embodiment, the second end of the lever arm is disposed at the level of the centre of gravity of the mass.

According to another embodiment, the second end of the lever arm is offset relative to the centre of gravity of the mass. This enables unwanted rotation of the mass to be prevented.

According to a first variant of the invention, the sensing axis is in the plane of the substrate.

According to one particular embodiment, the first end of the lever arm has a tapered shape along the sensing axis.

According to one particular embodiment, the first connection comprises two non-parallel blades forming a hinge adapted to allow rotation of the lever arm about the rotation axis perpendicular to the sensing axis.

According to one advantageous embodiment, the two blades are mutually perpendicular. This enables the same stiffness about the two perpendicular axes.

According to one particular embodiment, the second connection comprises a coupling blade rigid with respect to the sensing axis and flexible with respect to the rotation axis of the lever arm. This enables transmission to the lever of in-plane movement or shock that is not on the sensing axis to be prevented.

According to another particular embodiment, the second connection comprises a coupling wire rigid with respect to the sensing axis and flexible with respect to the axes perpendicular to said sensing axis. This further enables transmission to the lever of an out-of-plane movement or shock to be prevented.

According to a second variant of the invention, the sensing axis is perpendicular to the plane of the substrate.

According to one particular embodiment, the first connection comprises two colinear blades configured in such a manner as to form the rotation axis of the lever arm.

According to one particular embodiment, the second connection comprises a main coupling blade rigid with respect to the sensing axis and flexible with respect to the rotation axis. This enables transmission to the lever of in-plane movement or impact along at least one axis to be prevented.

According to one particular embodiment, the second connection further comprises at least one secondary coupling blade connected to the main coupling blade and perpendicular to said main coupling blade. This enables transmission to the lever of an in-plane movement or shock along both axes of the plane to be prevented.

The thickness of the lever arm is preferably substantially equal to that of the mass, which greatly facilitates the fabrication process.

The thickness of a strain gauge is preferably less than the thickness of the mass. Reducing the thickness of a gauge, and therefore its section, enables concentration of the stresses to which it is subjected because of the movement of the mass in a small section, the effect of which is to increase the sensitivity of the accelerometer.

Moreover, producing the lever arm/the mass and the gauge with different thicknesses enables them to be decoupled and therefore to be optimized separately.

The thickness of the mass and of the lever arm is preferably between 1 and 100 μm inclusive, for example less than or equal to 50 μm, and in general 20 μm (a value well suited to epitaxial growth).

The thickness of a gauge is preferably between 0.1 μm and 1.0 μm inclusive.

The thickness of the first pivot connection may be equal to that of the mass or to that of the gauge or between the two inclusive.

The thickness of the second coupling forming the coupling/decoupling connection may be equal to that of the mass or to that of the gauge or be between the two inclusive.

DESCRIPTION OF THE DRAWINGS

Other features and advantages of the invention will become apparent in the light of the following description given by way of nonlimiting illustration and with reference to the appended figures, in which.

DETAILED DESCRIPTION

Figure 1:
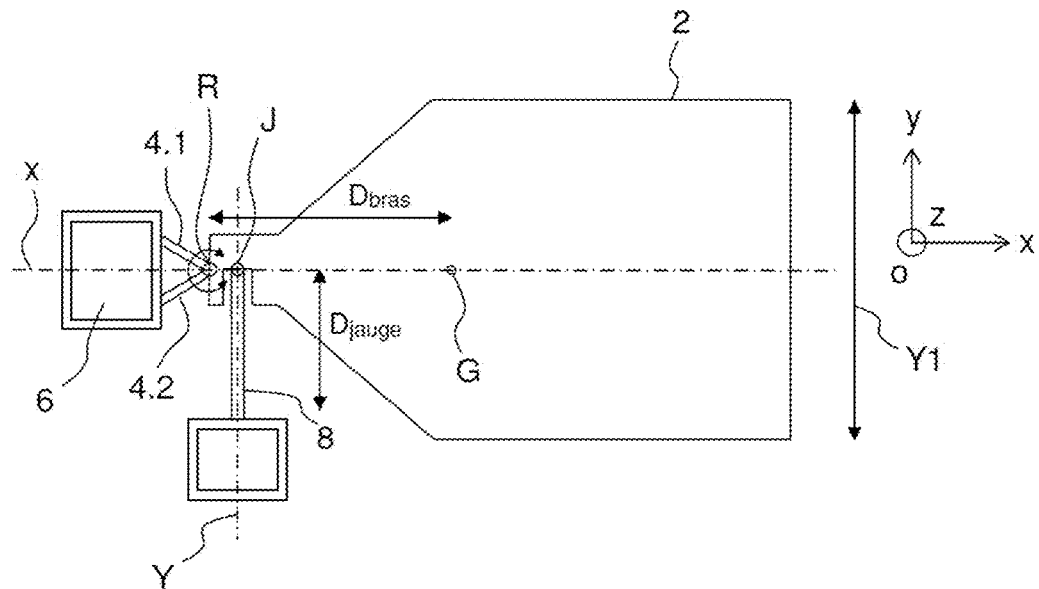
FIG. 1 shows a prior art accelerometer.
Figure 2:
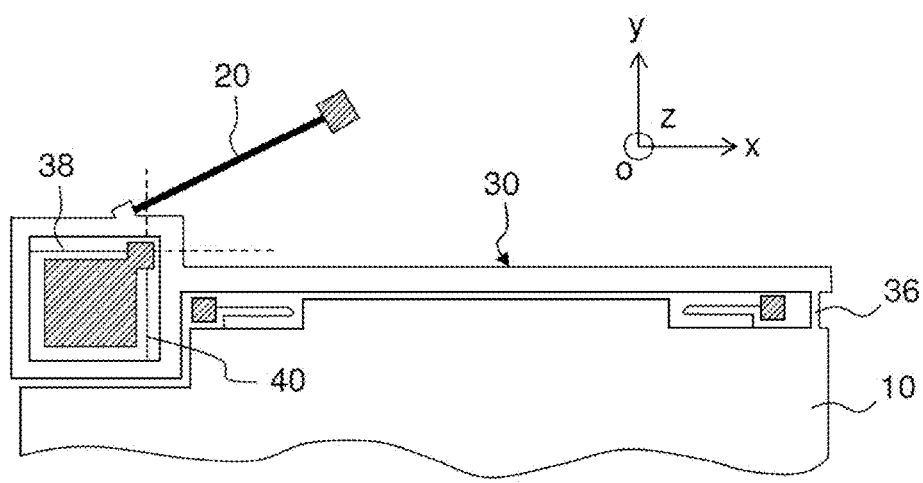
FIG. 2 shows another prior art accelerometer.
Figure 3:
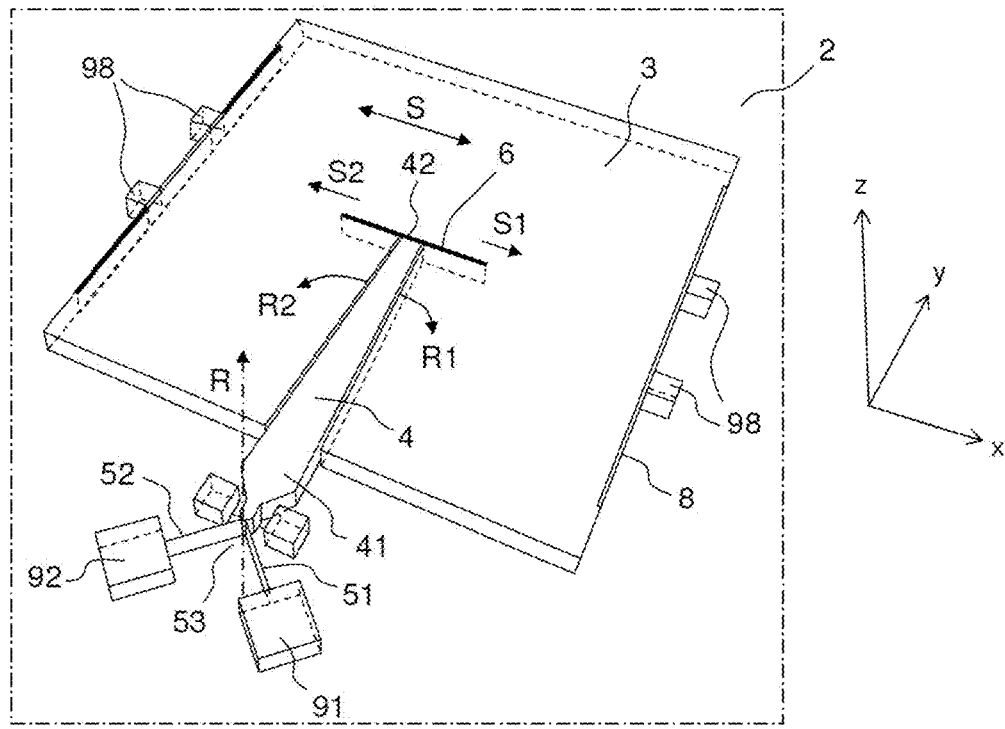
FIG. 3 shows an accelerometer according to a first embodiment.

FIGS. 1 and 2 show prior art accelerometers that have already been described hereinbefore and are not described again here.

Throughout the description, an anchor point on the substrate may also be referred to as a "pad" or an "anchor pad".

These are generally silicon anchor pads.

FIGS. 3, 4A, 4B, 5A, 5B, 6A and 6B show an accelerometer according to a first embodiment of the invention which is an in-plane accelerometer.

An accelerometer is termed "in-plane" when the sensing axis on which the mobile mass moves is situated in a plane parallel to the substrate.

The accelerometer 1 according to the first embodiment includes a mass 3 intended to be moved by the effect of an external force, in this instance the effect of an acceleration along a sensing axis S situated in the plane of the substrate, here in the plane XY. The mass 3 is mobile in translation relative to the substrate 2 along the sensing axis S.

In the example shown, the sensing axis S is parallel to the axis X. They could coincide in the description of the first embodiment.

In the example shown, the mobile mass 3 is suspended over the substrate 2 by means of at least one third connection 8. An anchor pad 98 fixes a third connection 8 to the substrate 2. The third connection is optional.

In the example shown there is a plurality of (four) third connections 8 disposed on the sides of the mass.

Each third connection 8 is attached to the substrate 2 by means of an anchor point 98. The four third connections are regularly distributed on the two sides of the mass perpendicular to the sensing axis S. The three connections retaining the mass are therefore distributed in a balanced manner relative to the centre of gravity. This prevents inducing a torque during movement in translation of the mass.

The third connections hold the mobile mass 3 substantially parallel to the substrate 2.

The combination of the third connections essentially leads to a single degree of freedom.

In the example shown, the combination of the third connections has essentially as the only degree of freedom movement in translation along the sensing axis S. In reality, the third connections are not perfectly rigid with respect to the other axes with the result that movements with respect to other degrees of freedom in translation or in rotation remain possible, but those movements are negligible compared to the movement in translation along the sensing axis S. Moreover, it is the combination of a plurality of third connections that prevents in-plane rotation of the mass, with the result that for simplicity it may be considered that there is only one degree of freedom in translation along said sensing axis.

The third connections comprise for example blades flexible with respect to the sensing axis but stiff with respect to the other axes. Such connections can be produced using blades that are sufficiently fine and therefore flexible with respect to the sensing axis. They may be larger and thicker, and consequently stiffer, with respect to another axis or with respect to all the other axes. For example (this is not shown), they may be thick with respect to the axis Z but fine with respect to the axis Y (or even as fine with respect to the axis Y as with respect to the axis X), which enables a compression stiffness very much greater than the bending stiffness for a blade to be obtained.

Figure 6A:
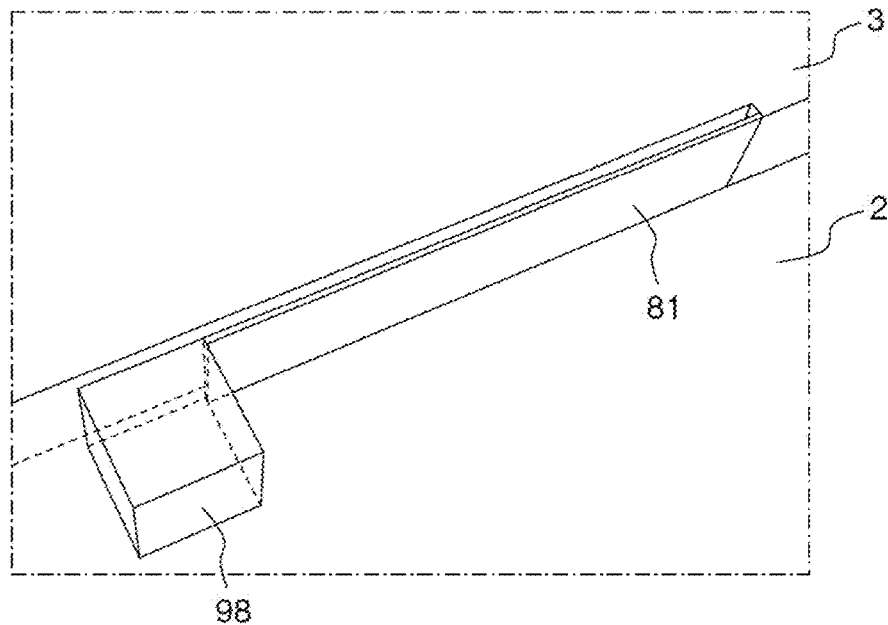
FIGS. 6A and 6B show two variants of a third detail of an accelerometer according to the first embodiment.

FIG. 6A shows a first example of a third connection formed by a single blade elongate with respect to the axis Y and fine with respect to the axis X that is parallel to the sensing axis S. Each blade 81 connects a pad 98 to the mass 3. In the plane of the accelerometer, a blade of this kind has a high stiffness in its lengthwise direction (axis Y) and a low stiffness with respect to the axis perpendicular to its length (axis X). Moreover, the blade also has a sufficient stiffness with respect to the axis Z not to allow movements of the mass with respect to said axis.

Figure 6B:
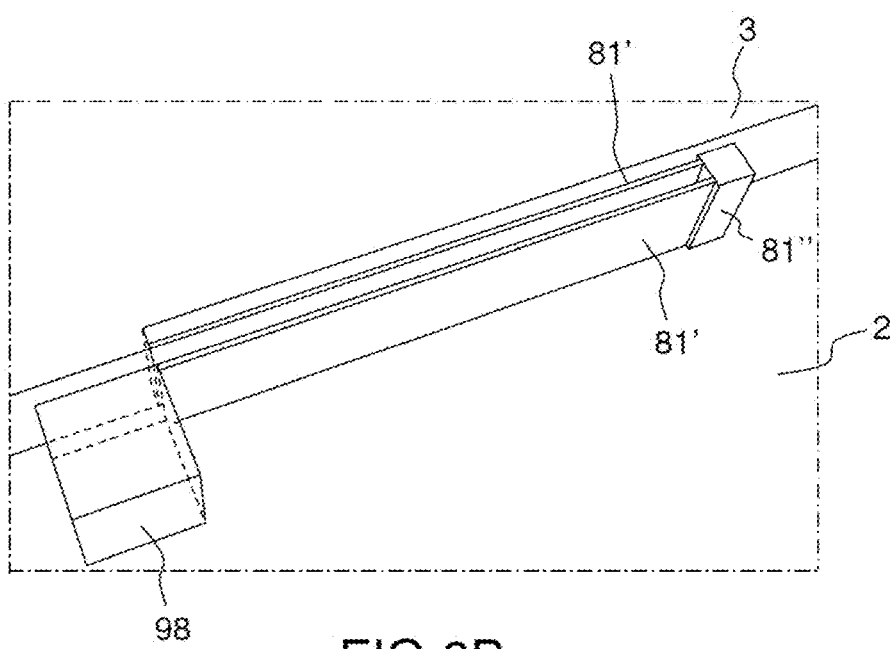
Figure 7:
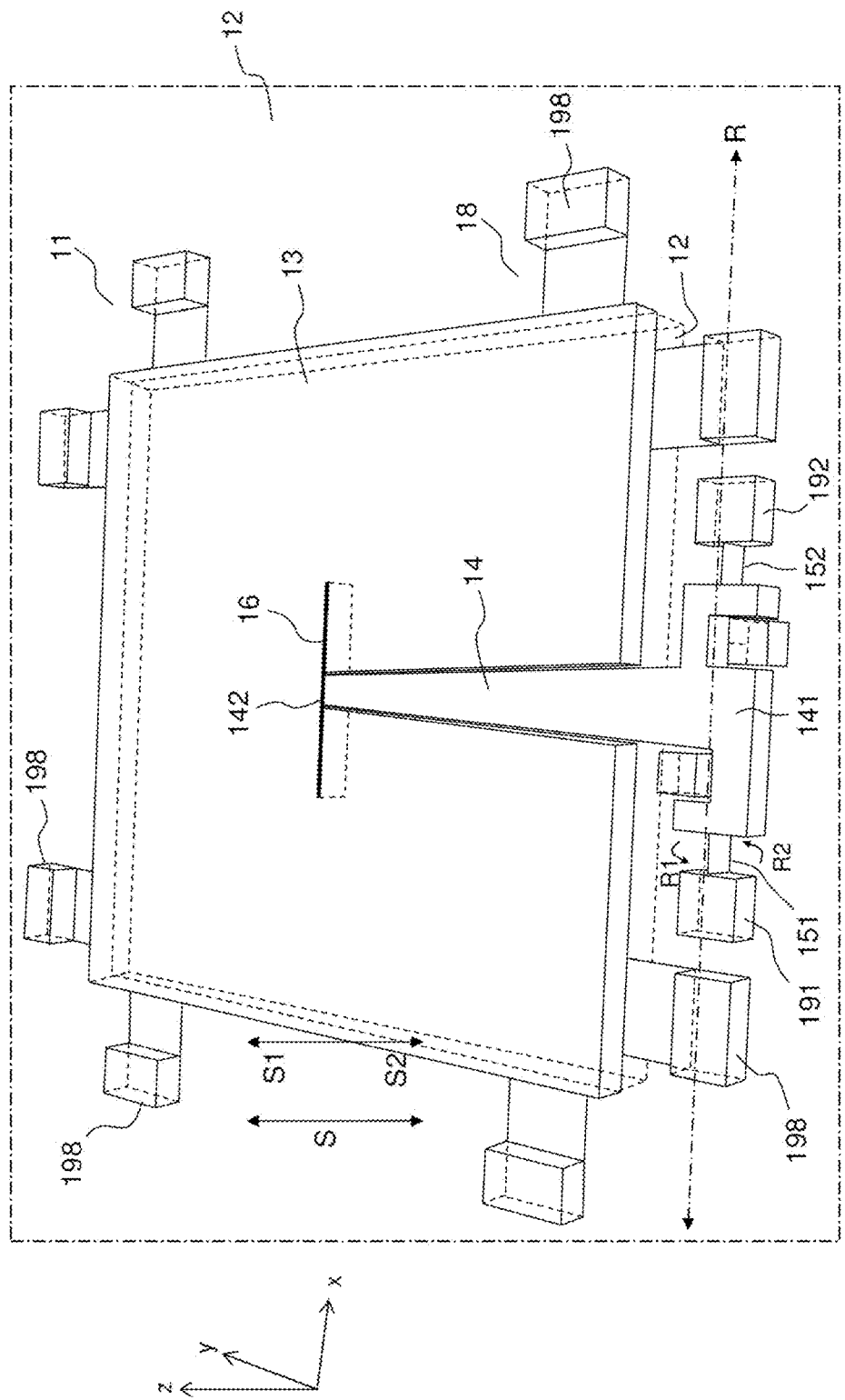
FIG. 7 shows an accelerometer according to a second embodiment.

FIG. 6B shows a second example of a third connection formed by a double blade, the two blades 81, 81' joining to form a U, each blade being elongate with respect to the axis Y and fine with respect to the axis X that is parallel to the sensing axis S. A first blade 81 is connected to a pad 98 and a second blade 81' is connected to the mass 3. The two blades 81 and 81' are moreover interconnected by an intermediate connecting part 81".

Compared to a single blade, a double blade of this kind produces less stiffness with respect to the axes perpendicular to the sensing axis but a much more linear response to the movement of the mass.

Other solutions exist for producing a third connection, that is to say to allow movement in translation of the mass 3 relative to the substrate 2 with respect to the sensing axis.

Alternatively, the connection between the substrate and the mass may be produced exclusively and directly by the lever arm 4.

A further alternative is for the connection between the substrate and the mass to be produced by one or more anchor points disposed on the substrate and situated in the central part or below the mobile mass (between the mass and the substrate), and by elastic connection arms elongate with respect to the axis Y connecting the mass and this anchor point or these anchor points.

The mobile mass 3 includes an area machined in such a manner as to form a lever arm 4 that has at least one degree of freedom relative to the mass 3.

The lever arm 4 comprises a first end 41 connected to the substrate 2 by means of a first connection 5. This first connection may be termed a "pivot connection". The lever arm is therefore suspended above the substrate 2.

The first connection 5 holds the lever arm 4 substantially parallel to the substrate 2.

The first connection 5 may advantageously be produced as shown in FIG. 4. It comprises two blades 51 and 52. Each blade 51, 52 has in the plane XY of the substrate an elongate dimension (length) defining its longitudinal direction and a fine dimension (width). Each blade is connected to the substrate 2 by means of an anchor point 91, 92.

The two blades are not parallel. The intersection of the blades, and to be more precise of axes extending in the longitudinal direction of each blade and situated on the half-width of each blade, cross over to form a rotation axis R perpendicular to the plane of the substrate.

Here the rotation axis R is parallel to the axis Z and they could coincide in the description of the first embodiment.

A hinge 53 is formed by the two blades, producing the rotation axis R of the lever arm 4.

The hinge is fixed by the great thickness in compression in the longitudinal direction of each of the blades. Nevertheless, said blades may be driven in bending with the lever arm 4, thus allowing the rotation of the said lever arm.

The blades may advantageously be mutually orthogonal so as to have the same stiffness in X and Y.

The hinge 53 thus enables movement in rotation of the lever arm 4 in the plane of the substrate about the rotation axis R. The intersection of the rotation axis R with the plane forms a rotation centre.

In the example shown, the thickness of the blades 51, 52 and therefore of the hinge 53 is equal to that of the mass 3.

In the example shown, two strain gauges 7, 7' are shown although only one gauge (or more than two gauges) may be installed.

Figure 4A:
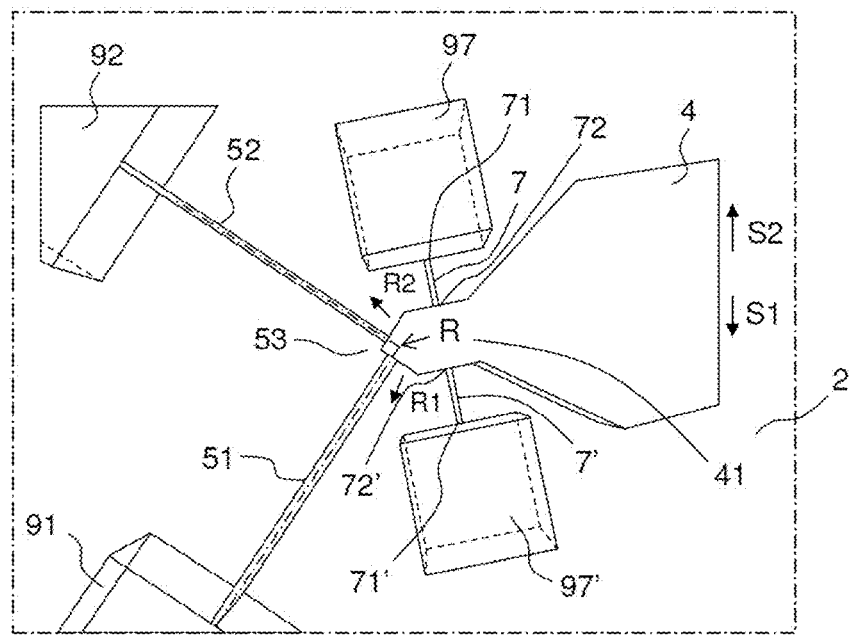
FIGS. 4A and 4B show two variants of a first detail of an accelerometer according to the first embodiment.

FIG. 4A shows more precisely a first configuration of the two strain gauges 7 and 7'. Each gauge 7, 7' is elongate with respect to the sensing axis S and fine and thin with respect to the other axes Y and Z. Each gauge comprises a first end 71, 71' connected to the substrate 2 by means of anchor pads 97, 97'.

In the example shown, the two strain gauges are disposed on respective opposite sides of the first end 41 of the lever arm. This enables provision of one gauge that functions in compression while the other functions in extension, which enables good differential measurement.

Moreover, in the first configuration shown in FIG. 4A, the blades form a flexible hinge. On the other hand, one gauge is not disposed perpendicularly to the axis connecting the rotation centre and the centre of the gauge, which can cause unwanted deformations of the gauge.

The gauges may be disposed in accordance with any other configuration with respect to the lever arm.

There is only one amplification structure (only one lever arm) for the two gauges.

In the example shown, the two strain gauges 7, 7' are disposed in a symmetrical manner with respect to the axis Y. Moreover, they are elongate with respect to the axis X, that is to say parallel to the sensing axis S.

Each gauge 7, 7' comprises a second end 72, 72' connected to the lever arm 4.

Figure 4B:
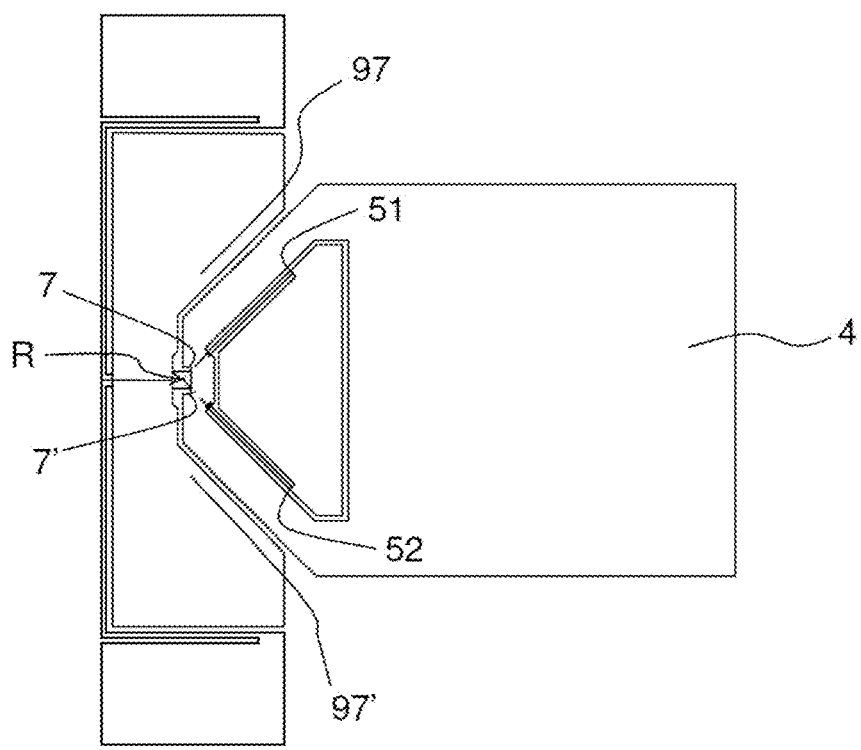

The gauges may be elongate with respect to an axis other than the sensing axis and disposed in a second configuration as shown in FIG. 4B.

In this second configuration the two gauges 7, 7' are parallel to one another and each connected to an anchorage 97, 97' and to the lever arm 4 (the mass 3 is not shown in the figure).

Each gauge is therefore perpendicular to the axis connecting the rotation axis R and the centre of the gauge. This enables each gauge to function in compression, to exhibit a pure angular bending movement and to be less stressed by unwanted movements.

On the other hand, in this configuration the two blades forming the hinge cannot be joined directly, which increases the angular stiffness of the hinge. The pivot is less good.

During acceleration, the mass 3 is caused to move along the axis S, either in the direction S1 or in the direction S2. The movement in translation of the mass 3 is transferred to the lever 4 which transforms it into a movement in rotation about the rotation axis R, either in the direction R1 or in the direction R2.

The movement in rotation (along a circular arc R1 or R2 in the plane XY of the substrate) of the lever arm 4 and therefore of the first end 41 of said lever arm applies a stress to each gauge 7, 7' that is either a compression stress for the gauge toward which the movement is oriented or a tension stress for the other gauge. Thus one gauge functions in compression while the other gauge functions in tension, which enables differential measurement.

As shown, the first end 41 of the lever arm 4 preferably has a tapered shape, that is to say is thinner with respect to the axis X than the rest of the lever arm. The mechanical connection between each gauge and the lever arm is therefore situated as close as possible to the plane containing the centre of gravity of the mass and the rotation axis R. The movement of the lever arm is therefore parallel to the gauge. This has the advantage of the purest possible compression/extension movement of the gauge (with no bending).

The gauges are moreover placed close to the hinge 53 to benefit best from the amplification produced by the lever arm.

The lever arm 4 comprises a second end 42 connected to the mass 3 via a second connection 6. This second connection may equally be termed a "coupling connection" or a "coupling/decoupling connection". It must transmit movement of the mass along the sensing axis S to the lever arm and cause movement in translation of the mass to coexist with rotation of said lever arm.

This second connection between the lever arm and the mass is disposed in the central part of the mass.

The second connection may comprise a coupling blade or a coupling wire.

Figure 5A:
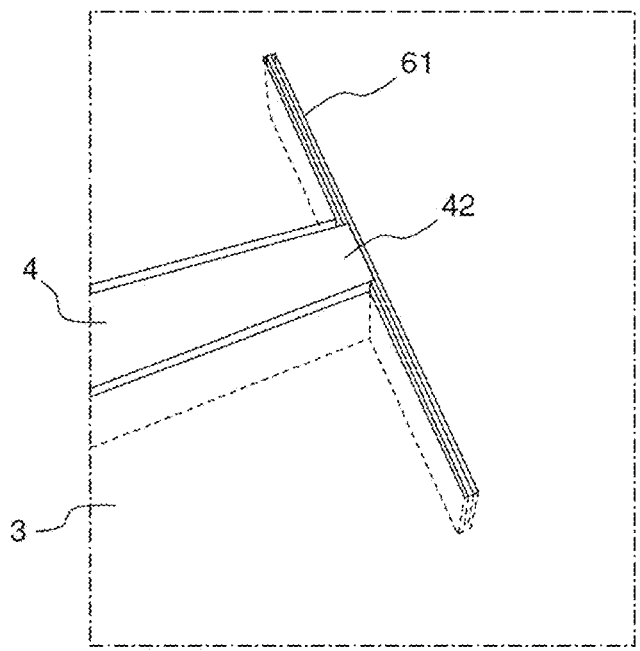
FIGS. 5A and 5B show two variants of a second detail of an accelerometer according to the first embodiment.

FIG. 5A shows a first variant of the second connection, which is a coupling blade.

The bending of the blade with respect to the axis Y enables the circular arc movement in rotation of the end of the lever arm to coexist with rectilinear movement in translation of the mass.

The coupling blade 61 is a blade elongate with respect to the axis X in such a manner as to be sufficiently rigid to transmit the movement in translation of the mass 3 to the lever arm 4 and fine with respect to the axis Y in such a manner as to allow rotation of the lever arm 4 relative to the mass 3.

Thanks to a coupling blade of this kind, the movement of the mass with respect to the other axis in the plane (the axis Y) is not transmitted to the lever arm, because in contrast the blade bends with respect to that axis because of its fineness (it is said to induce decoupling). This confers an advantage in the event of an impact with respect to said axis, which impact is not transferred to the lever arm. The latter impact therefore does not interfere with the movement transmitted by the mass via the lever arm and measured by the gauge(s).

On the other hand, the coupling blade 61 has a non-negligible thickness (the coupling blade is produced in the same thick layer as the mass 3). This confers on it a non-zero stiffness with respect to that axis, and so an out-of-plane shock can be transmitted to the lever arm.

The coupling blade may be produced during deep etching enabling etching of the thick layer, likewise the mass and the hinge.

Figure 5B:
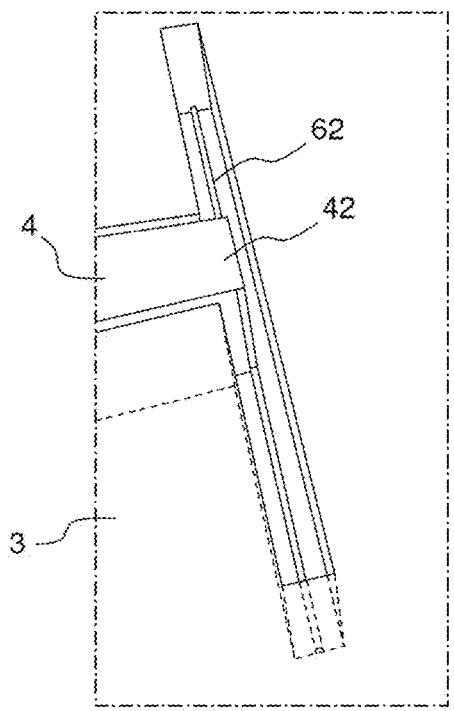

FIG. 5B shows a second variant of the second connection that is a coupling wire.

By definition, a coupling wire 62 is thinner than a coupling blade. This also enables decoupling of the movement of the mass 3 with respect to the axis Z. The other dimensions are equivalent to those of a coupling blade. However, the dimension with respect to the axis Y may be shorter to compensate the reduced stiffness (this is not shown in the figure). A coupling wire of this kind therefore has low stiffness with respect to the axes Y and Z and high stiffness with respect to the axis X.

The coupling wire may be produced when etching the thin layer, just like the strain gauges.

FIGS. 7, 8A, 8B, 9, 10A and 10B show an accelerometer according to a second embodiment of the invention, which is an out-of-plane accelerometer.

An accelerometer is termed "out-of-plane" when the axis sensing movement of the mobile mass is an axis perpendicular to the plane of the substrate.

The accelerometer 11 according to the second embodiment includes a mass 13 intended to be moved by the effect of an external force, in this instance by the effect of an acceleration perpendicular to the plane of the substrate 12 with respect to a sensing axis S. Here the plane of the substrate is the plane XY and the sensing axis S is parallel to the axis Z. The axis S and the axis Z may coincide in the remainder of the description of the second embodiment.

The mass 13 is mobile in translation relative to the substrate 12 in a movement in translation with respect to the sensing axis S.

The mobile mass 13 is suspended over the substrate 12 by means of at least one third connection 18. At least one anchor pad 198 fixes the third connection 18 to the substrate 12.

The third connection is optional.

In the example shown the third connection in fact consists of a plurality of third connections 18 disposed on the sides of the mass. Each third connection is attached to the substrate 2 by means of an anchor pad 198.

In the example shown the third connections are regularly distributed on the four sides of the mass 13. The third connections retaining the mass are therefore distributed in a balanced manner relative to the centre of gravity of said mass. This prevents induction of torque during movement in translation of the mass.

Each third connection essentially has only one degree of freedom in translation (along the axis Z), but may have at least one degree of freedom in rotation.

According to the example shown, the third connections essentially have as their only degree of freedom movement in translation along the sensing axis S, out-of-plane rotation, movement in translation and in-plane rotation are blocked by their joint action. In reality, in-plane movements in translation and in rotation are not perfectly blocked with the result that those movements remain possible, but are negligible compared to the other movements, and in particular the movement in translation along the sensing axis S. Moreover, it is the combination of a plurality of third connections that prevents in-plane movements with the result that for simplicity it may be considered that there is only one degree of freedom in translation along said sensing axis.

The third connections are for example blades flexible with respect to the sensing axis S but stiff with respect to the other axes. Such connections may be produced using blades sufficiently thin and consequently sufficiently flexible with respect to the sensing axis S but sufficiently wide and consequently sufficiently stiff with respect to the other axes.

Figure 9:
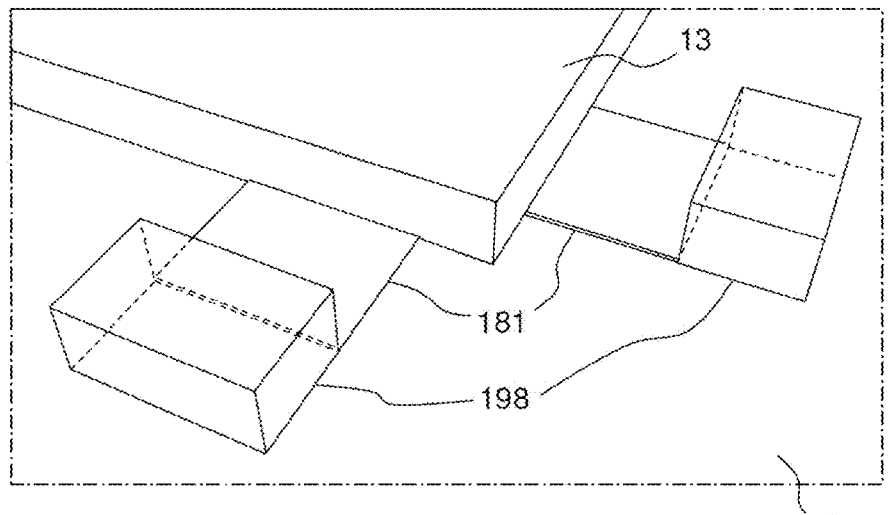
FIG. 9 shows a second detail of an accelerometer according to the second embodiment.

FIG. 9 shows an example of a third connection formed by a blade elongate with respect to the axes X and Y and thin with respect to the axis Z that is parallel to the sensing axis S. As there is a plurality of third connections 18, there is a plurality of blades 181. Each blade 181 is connected to the mass 13 and to an anchor pad 198. A blade 181 has a high stiffness in the plane of the accelerometer and a low stiffness with respect to the axis Z.

Other solutions exist for producing a third connection, that is to say for allowing movement in translation of the mass 13 relative to the substrate 12 along the sensing axis S.

Alternatively, the connection between the substrate and the mass may be produced only and directly by the lever arm 14.

A further alternative is for the connection between the substrate and the mass to be produced by one or more anchor points fixed to the substrate and situated in the central part of and below the mobile mass (between the substrate and the mass) and connected to the mass by connecting arms elastic with respect to the axis Z.

The mobile mass 13 includes a zone machined to form a lever arm 14 that has at least one degree of freedom relative to the mass 13.

The lever arm 14 comprises a first end 141 connected to the substrate 12 by two blades 151 and 152 forming the first connection 15. This first connection may be termed a "pivot connection". The lever arm 14 is therefore suspended over the substrate 12. This is more specifically shown in FIG. 8.

Each blade 151, 152 is connected to the substrate 12 by an anchor point 191, 192.

In the example shown, the two blades 151 and 152 are elongate along the axis X and colinear along the same axis X. They are fine with respect to the axis Y and there are two of them so as to form substantially only one degree of freedom, which is in torsion about a rotation axis R that is parallel to the axis X (and therefore perpendicular to the sensing axis). In the description of the second embodiment the axes R and X could coincide. The two blades 151, 152 allow movement in rotation of the lever arm 14 about said rotation axis.

In the example shown two strain gauges 17, 17' are shown although only one gauge (or more than two gauges) may be installed.

Figure 8A:
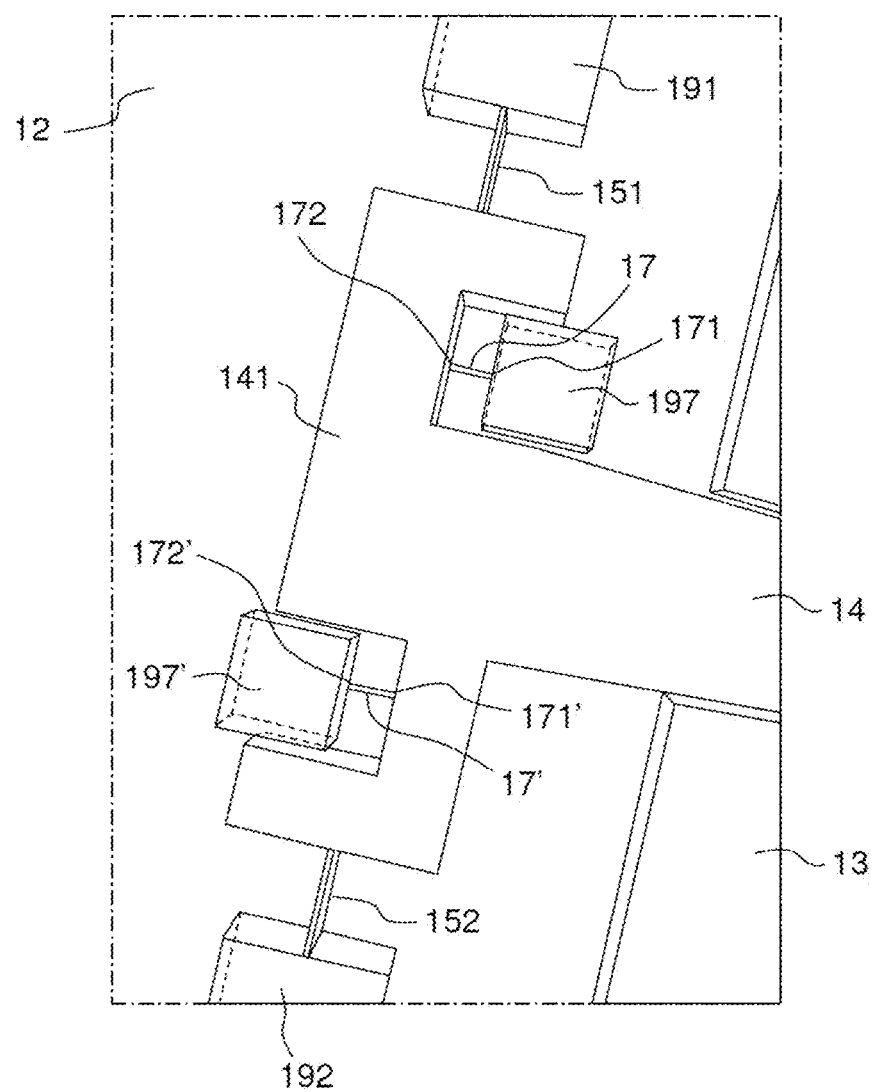
FIGS. 8A and 8B show two variants of a first detail of an accelerometer according to the second embodiment.

FIG. 8A shows more precisely a first configuration for the two strain gauges 17 and 17'. Each gauge 17, 17' is elongate along the axis Y and is thin and fine with respect to the other axes X and Z. Each gauge comprises a first end 171, 171' connected to the substrate 12 by means of anchor pads 197, 197'.

The two strain gauges are disposed on respective opposite sides of the first end 141 of the lever arm. In the example shown, the two strain gauges 17, 17' are symmetrically disposed with respect to the axis X that corresponds to the rotation axis R. This enables a gauge to be obtained that functions in compression while the other gauge functions in tension, which enables good differential measurement.

The gauges may be disposed in accordance with any other configuration with respect to the lever arm.

There is only one amplification structure (only one lever arm) for the two gauges.

Each gauge 17, 17' comprises a second end 172, 172' connected to the lever arm 14.

When acceleration occurs in the environment, the mass 13 is caused to move along the axis S, either in the direction S1 or in the direction S2. The movement in translation of the mass 13 along the axis S is transferred to the end of the lever 14, which rotates about the rotation axis R, either in the direction R1 or in the direction R2.

The movement in rotation of the lever arm 14 applies a stress to each gauge 17, 17' that is either a compression stress for the gauge toward which the movement is oriented or a tension stress for the other gauge. Thus one gauge functions in compression while the other gauge functions in tension.

As shown, the first end 141 of the lever arm 4 preferably has a specific shape. The two gauges are therefore placed directly below the rotation axis R in order to be loaded to the maximum in compression and/or in tension. This has the advantage of the purest possible movement of the gauge in compression/tension (with no unwanted bending).

Figure 8B:
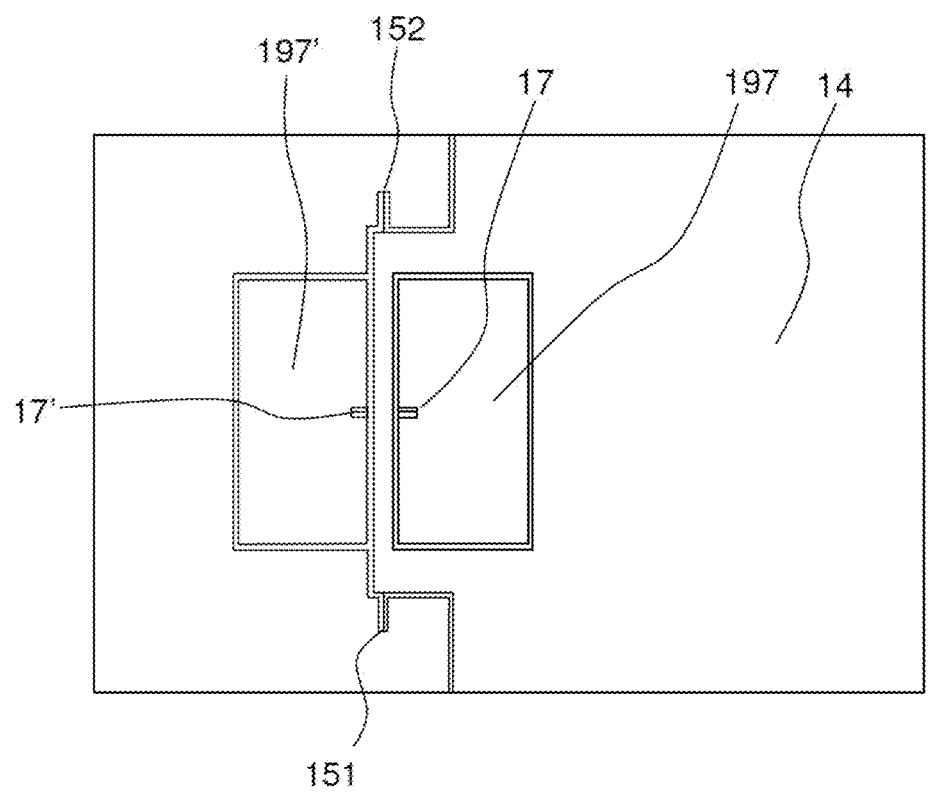

A second configuration for the gauges and the blades enables the gauges to be positioned face to face as shown in FIG. 8B.

In this second configuration the two gauges 17, 17' are parallel to each other and each is connected to an anchorage 197, 197' and to the lever arm 14 (the mass is not represented in the figure). The blades 151 and 152 are still oriented with respect to the same axis X.

This enables a symmetrical design to be retained to obtain the best possible differential measurement.

The lever arm 14 comprises a second end 142 connected to the mass 13 via a second connection 16. This second connection may also be termed a "coupling connection" or a "coupling and decoupling connection". It must transmit the movement of the mass with respect to the sensing axis S to the lever arm and to cause movement in translation of the mass to coexist with rotation of said arm about the rotation axis R.

This second connection between the lever arm and the mass is disposed in the central part of the mass.

The second connection may comprise a single coupling blade or a main coupling blade and one or more secondary coupling blades.

Figure 10A:
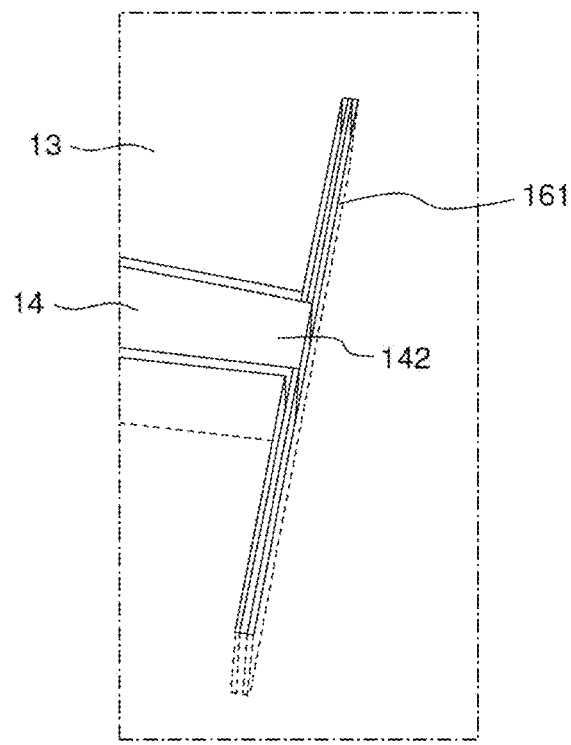
FIGS. 10A and 10B show two variants of a third detail of an accelerometer according to the second embodiment.

FIG. 10A shows a first variant of a second connection comprising a coupling blade.

The coupling blade is used in torsion and in bending to cause circular arc movement in rotation of the end of the lever arm about the axis X to coexist with rectilinear movement in translation of the mass along Z.

The coupling blade 161 is a blade elongate with respect to the axis X and having a non-negligible height with respect to the axis Z (corresponding to the thickness of the mass 13) so as to be sufficiently rigid to transmit movement in translation of the mass 13 to the lever arm 14 along said axis. The coupling blade 161 is fine with respect to the axis Y so as to allow rotation of the lever arm 14 about the rotation axis R (parallel to the axis X) in Y.

Thanks to a coupling blade of this kind, in-plane movement of the mass 13 with respect to the axis Y is not transmitted to the lever arm because, to the contrary, the blade is twisted with respect to this axis because of its fineness (it is said to be decoupled). This confers an advantage in the event of an impact along the axis Y that is not transferred to the lever arm. This therefore does not interfere with the transmitted movement measured by the gauge(s). The gauge is therefore protected in the event of shock and in normal operation there is less transverse sensitivity.

On the other hand, the high compression stiffness of the coupling blade 161 with respect to the axis X transmits shocks with respect to the axis X to the lever arm.

The coupling blade may be duplicated in order to improve the linearity of the device.

Figure 10B:
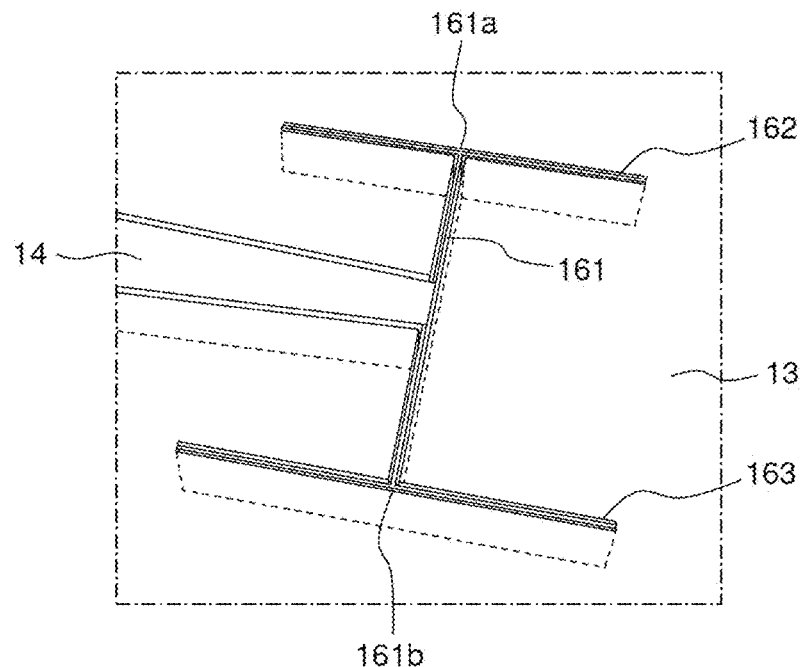

FIG. 10B shows a second variant of a second connection comprising a plurality of coupling blades. This second variant of the second connection is distinguished from the first variant in that it further comprises two secondary coupling blades 162, 163 disposed perpendicularly to the main coupling blade 161 and respectively fixed to a first end 161a and a second end 161b of said main coupling blade. The thicknesses of the three coupling blades are identical. The secondary coupling blades 162 and 163 are elongate with respect to the axis Y and fine with respect to the axis X while the main coupling blade 161 is elongate with respect to the axis X and thin with respect to the axis Y. The secondary coupling blades enable decoupling of movement between the mass 13 and the lever arm 14 with respect to the other axes Y in the plane.

This second variant of the second connection therefore has the advantage of enabling coupling between the mass 13 and the lever arm 14 only with respect to the sensing axis S. There generally also remains out-of-plane rotation, which is difficult to prevent.

The accelerometer according to the invention enables movement in translation of the mass and movement in rotation of the lever arm to be dissociated.

The mass moving in translation, its effect on the moment of inertia as seen from the lever arm is slight because it approximates that of a point mass. This therefore enables a better compromise between the size of the mass (and therefore the weight of the mass), the sensitivity of the accelerometer and the resonant frequency and, in particular for an accelerometer of given mass, a better product of resonant frequency times sensitivity.

Also, the connection between the lever arm and the mass being disposed in the central part of the mass, this avoids the risk of imperfect symmetry and consequently prevents the mass from turning at the same time as the lever arm. If the mass were to turn at the same time, the moment of inertia of the mass would again increase and the resonant frequency would be reduced, which the invention makes it possible to prevent.

Moreover, this enables there to be two gauges for one lever arm, the two gauges being close together, thereby improving the measurement accuracy, in particular in the event of differential measurement.

A single lever arm enables lever arm differences to be avoided. With only one lever arm, differences are not transmitted to the gauges.

Moreover, the invention enables management of in-plane movement of the substrate or of out-of-plane movement.

According to the invention, the lever arm is etched at the heart of the mass. The centre of gravity or barycentre of the mass is therefore not at the intersection of the diagonals of the rectangle forming the mass when the mass is a rectangle or more generally at the geometrical centre of the plane of the mass.

It has been shown that the coupling of the mass to the lever arm is provided by a second connection elastic in torsion and/or in bending.

The stiffness of the second connection is much lower than the thickness of the lever arm.

However, some stiffness nevertheless remains, which leads to a torque that causes the mass to turn. The coupling between rotation of the lever arm and that of the mass, even though weak, can therefore induce unwanted rotation of the mass if it is not counterbalanced.

Figure 11:
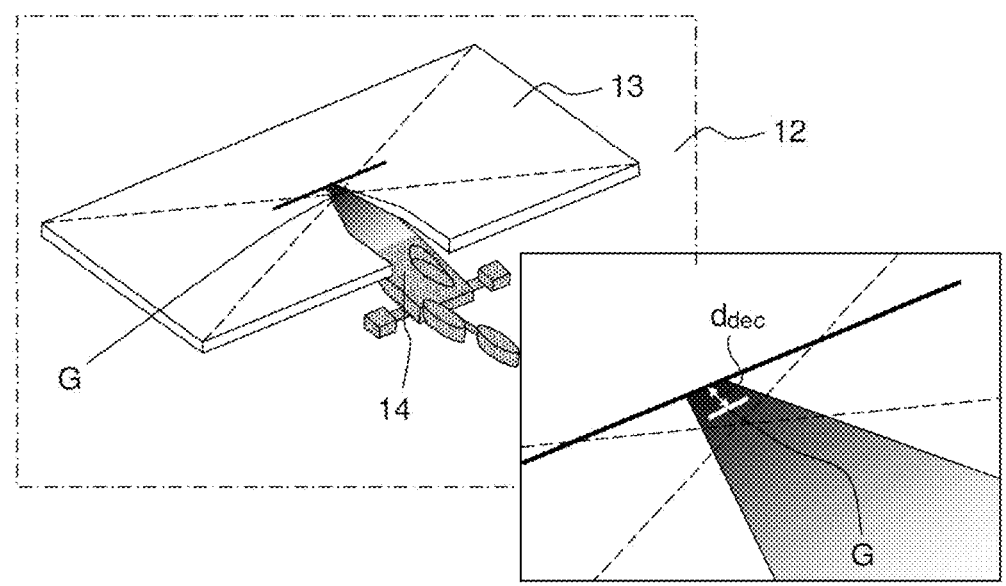
FIG. 11 shows one particular embodiment of the invention.

FIG. 11 shows a particular embodiment of the invention that enables further improvement of the accelerometer by preventing unwanted rotation of the mass. This embodiment may be applied to the first embodiment (in-plane) and to the second embodiment (out-of-plane).

According to this embodiment, the connection between the lever arm and the mass is slightly offset relative to the centre of gravity of the mass so as to induce a counter-torque. An astutely chosen offset enables cancellation of the torque of the second connection that can cause the mass to turn.

By way of example there is chosen an offset in the lengthwise direction of the lever arm and in the direction opposite said arm.

To calculate the value of this offset $d_{dec}$ the following calculations may be used.

The moment $M_{cpig}$ engendered by the coupling connections (second connections) is the product of the angle $\alpha_{bras}$ of the lever arm times the angular stiffness $C_{cpig}$ of the coupling connections:

$$M_{cipg} = C_{cpig} \alpha_{bras}$$

The angle $\alpha_{bras}$ of the lever arm may be expressed on the basis of its length $D_{bras}$ and the movement of the mass $\Delta L_{masse}$ at the level of the second connection (the movement will be the same everywhere if movement in translation of the mass is actually achieved). The movement being very small compared to the length, the tangent and the angle coincide, thus:

$$\alpha_{bras} = \frac{\Delta L_{masse}}{D_{bras}}$$

The offset between the centre of gravity of the mass and the point of connection between the coupling connection and said mass induces a moment that is the product of the force, itself produced by the weight m of the mass, and the acceleration γ, times this offset:

$$M_{dec} = d_{dec} m \gamma$$

For these two torques to cancel out, it is therefore necessary to chose the offset carefully so that $M_{cpig} = M_{dec}$; that is to say:

$$d_{dec} = C_{cplg} \frac{\Delta L_{masse}}{D_{bras}} \frac{1}{m\gamma}$$

Finally the movement of the mass (like a spring with its lever) and the acceleration are connected by the resonant frequency $\omega_0$:

$$\Delta L_{masse} = \frac{\text{Force}}{\text{Raideur}} = \frac{m\gamma}{K} = \frac{m\gamma}{m\omega_0^2} = \frac{\gamma}{\omega_0^2}$$

In conclusion, the offset value is obtained:

$$d_{dec} = C_{cplg} \frac{1}{D_{bras}} \frac{1}{m\omega_0^2}$$

A first thin zone/layer having a first thickness can form at least the piezoelectric gauge(s).

By "thin" must be understood of the order of 100 nanometres (nm) thick and less than 1 micrometre (μm) thick.

The (optional) third connections may be produced in the thin layer.

In some variants, the second connection may be produced in the thin layer (coupling wire).

A second thick zone/layer having a second thickness greater than the first thickness can form at least the seismic mass.

By "thick" must be understood between 1 μm and 100 μm thick. The thick layer is preferably between 1 and 20 μm thick or even between 1 and 10 μm thick.

The thick zone/layer can form a second connection in some variants (coupling blade) and/or the first connection (pivot connection).

The strain gauges may be piezoelectric or piezoresistive gauges, resonant beams.

The various embodiments described may be combined.

The structure of the accelerometer may be fabricated using known accelerometer silicon micromachining (and/or nanomachining) technologies.

The following general process may therefore be employed:
  we start with silicon on insulator (SOI) comprising at least one Si substrate layer, a sacrificial $SiO_2$ layer and a thin Si layer;
  a thicker Si layer is deposited by epitaxial growth of Si or by applying a thicker layer on top of the thin Si layer of the SOI;
  patterns are defined on the SOI and/or on the thick layer, for example by photolithography;
  Si or $SiO_2$ layers are etched in order to finalize the required patterns in such a manner as to form the lever arm, the mass, the connections, the pad and the gauge(s);
  a metal layer, for example a layer of superposed chromium and gold, may be deposited to define the electrical connections; and
  the mobile parts are freed by removing (for example by means of acid or vapour etching) the $SiO_2$ on which these mobile parts rest (to this end the mobile parts may be pierced with multiple small holes through which the oxide can be evacuated, leaving the mobile parts overlying the top of the substrate).

By way of example, the following process may be used. We start from an SOI (Silicon On Insulator) substrate including for example a first layer of silicon (Si) forming the substrate, a first layer of silicon oxide ($SiO_2$ or buried oxide), for example 1 μm thick, and a second layer of Si on the first layer of $SiO_2$. The first layer of $SiO_2$ forms the sacrificial layer.

The second layer of Si is preferably a layer of monocrystalline silicon. It has for example a thickness of 0.3 μm or of 0.15 μm. This second layer of Si advantageously forms the thin layer.

There then follows photolithography followed by etching of the second layer of Si to define at least one gauge and to define the pad anchoring said gauge to the substrate. The etching is stopped at the first layer of $SiO_2$.

Thereafter a second layer of $SiO_2$ is deposited that is intended to form a stop layer. There follows photolithography intended to delimit a portion of the second layer of $SiO_2$ that covers a gauge (or a plurality of portions if there is a plurality of gauges). The second layer of $SiO_2$ is then etched, eliminating the latter except at the level of each portion.

The first layer of $SiO_2$ is also etched so as to be able to produce pads (in the following step).

During a following step, a third layer of Si is deposited by epitaxial growth on the second layer of Si and on each portion of the second layer of $SiO_2$ that covers each gauge. This third layer of Si advantageously forms the thick layer. This layer has for example a thickness of 20 μm or 15 μm. It includes for example a part formed of monocrystalline silicon and a part formed of polycrystalline silicon on top of each portion of the second layer of $SiO_2$.

In a subsequent step photolithography of the third layer of Si defines the location of the anchor pads.

In a subsequent step, a metal layer may be deposited in which the electrical contacts will be produced, after which photolithography may be applied to that metal layer to protect the metal layer and to position it just above the anchor pads, and the metal layer is finally etched to leave only the metal contacts on the anchor pads.

In a subsequent step photolithography is effected to enable selective etching of the third layer of Si, in particular to eliminate the portion of polycrystalline silicon situated on top of the piezoresistive gauge and to define the lever arm, the mass, the connections and the anchor pads on the first layer of Si (or substrate). Vertical etching is thereafter effected in the thickness of the third layer of Si as far as the first layer of SiO$_2$ or the portion of the second layer of SiO$_2$ that covers the gauge. The etching may be DRIE (Deep Reactive Ion Etching).

In a subsequent step the lever arm, the mass and the connections are freed by removing the first layer of SiO$_2$ and each gauge is freed by removing the portion of the second layer of SiO$_2$, for example by means of hydrofluoric acid in liquid and/or vapour form.

This etching may be etching over time, in which case the hydrofluoric acid is left in contact with the first layer of SiO$_2$ the time necessary to free certain mobile parts but to leave said layer of SiO$_2$ under the fixed parts.

In this example, all the connections are produced in the thick layer. A process of the same type may be adapted to produce certain connections in the thin layer and others in the thick layer.

The process may be adapted to produce the various variants of the accelerometer.

Moreover, the present invention is not limited to the embodiments described above but encompasses any embodiment falling within the scope of the claims.

The invention claimed is:

1. An MEMS or NEMS accelerometer adapted to measure an acceleration along a sensing axis comprising:
   a substrate featuring a plane;
   a mass having a central zone and suspended relative to the substrate;
   a single lever arm forming a mass force amplification structure, comprising:
      a first end connected to the substrate by means of a first connection adapted to allow rotation of the lever arm about a rotation axis perpendicular to the sensing axis, and
      a second end connected to the mass by means of a second connection adapted to transmit a movement in translation of the mass to the lever arm whilst allowing rotation of said lever arm about the rotation axis;
   the second end of the lever arm being disposed at a level of the central zone of the mass;
   further comprising at least one strain gauge, said gauge being connected to the lever arm, each gauge comprising:
      a first end connected to the substrate, and
      a second end connected to the lever arm,
   the second connection comprising a main coupling blade rigid along the sensing axis and flexible about the rotation axis of the lever arm.

2. The accelerometer according to claim 1, comprising at least two strain gauges.

3. The accelerometer according to claim 2, the two strain gauges being disposed on respective opposite sides of the first end of the lever arm.

4. The accelerometer according to claim 1, the mass being suspended relative to the substrate by at least one third connection adapted to allow the translation of said mass along the sensing axis.

5. The accelerometer according to claim 4, the at least one third connection comprising a flexible blade along the sensing axis.

6. The accelerometer according to claim 4, comprising a plurality of third connections distributed in a balanced manner relative to a centre of gravity of the mass.

7. The accelerometer according to claim 1, the mass being suspended relative to the substrate only by the lever arm.

8. The accelerometer according to claim 1, the second end of the lever arm being disposed at the level of a centre of gravity of the mass.

9. The accelerometer according to claim 1, the second end of the lever arm being offset ($d_{dec}$) relative to a centre of gravity of the mass.

10. The accelerometer according to claim 1, the sensing axis being in the plane of the substrate.

11. The accelerometer according to claim 10, the first end of the lever arm having a tapered shape along the sensing axis.

12. The accelerometer according to claim 10, the first connection comprising two non-parallel blades forming a hinge adapted to allow the rotation of the lever arm about the rotation axis perpendicular to the sensing axis.

13. The accelerometer according to claim 12, the two blades being mutually perpendicular.

14. The accelerometer according to claim 1, the sensing axis being perpendicular to the plane of the substrate.

15. The accelerometer according to claim 14, the first connection comprising two colinear blades configured to form the rotation axis of the lever arm.

16. The accelerometer according to claim 15, the second connection further comprising at least one secondary coupling blade connected to the main coupling blade and perpendicular to said main coupling blade.

* * * * *